(12) United States Patent
Barclay et al.

(10) Patent No.: US 11,862,573 B2
(45) Date of Patent: Jan. 2, 2024

(54) NAND FLASH BLOCK ARCHITECTURE ENHANCEMENT TO PREVENT BLOCK LIFTING

(71) Applicant: Micron Technology, Inc., Boise, ID (US)

(72) Inventors: Martin Jared Barclay, Middleton, ID (US); Mark Tunik, Portland, OR (US)

(73) Assignee: Micron Technology, Inc., Boise, ID (US)

( * ) Notice: Subject to any disclaimer, the term of this patent is extended or adjusted under 35 U.S.C. 154(b) by 115 days.

(21) Appl. No.: 16/984,962

(22) Filed: Aug. 4, 2020

(65) Prior Publication Data
US 2022/0045015 A1  Feb. 10, 2022

(51) Int. Cl.
| | |
|---|---|
| *H01L 23/00* | (2006.01) |
| *H01L 23/535* | (2006.01) |
| *H01L 21/768* | (2006.01) |
| *H10B 20/00* | (2023.01) |
| *H10B 41/10* | (2023.01) |
| *H10B 41/27* | (2023.01) |
| *H10B 41/50* | (2023.01) |
| *H10B 43/10* | (2023.01) |
| *H10B 43/27* | (2023.01) |
| *H10B 43/50* | (2023.01) |

(52) U.S. Cl.
CPC ........ *H01L 23/562* (2013.01); *H01L 21/7684* (2013.01); *H01L 21/76895* (2013.01); *H01L 23/535* (2013.01); *H10B 20/00* (2023.02); *H10B 41/10* (2023.02); *H10B 41/27* (2023.02); *H10B 41/50* (2023.02); *H10B 43/10* (2023.02); *H10B 43/27* (2023.02); *H10B 43/50* (2023.02)

(58) Field of Classification Search
CPC ......................... H01L 27/11575; H01L 27/112
See application file for complete search history.

(56) References Cited

U.S. PATENT DOCUMENTS

2019/0067320 A1*  2/2019  Cho .................... H01L 23/5226

* cited by examiner

*Primary Examiner* — Farun Lu
(74) *Attorney, Agent, or Firm* — Greenberg Traurig (57) ABSTRACT

Disclosed is a three-dimensional memory device. In one embodiment, a device is disclosed comprising a source plate; plugs fabricated fabricated on or partially formed in the source plate; a stack formed on the substrate and plugs comprising alternating insulating layers and conductive layers and channel-material strings of memory cells extending through the insulating layers and conductive layers; a first set of pillars extending through the stack formed by a process including etching the alternating insulating layers and conductive layers and depositing a pillar material therein, wherein each pillar in the first set of pillars terminates atop a respective plug in the plurality of plugs; and a second set of pillars extending through the stack formed by a process including etching the alternating insulating layers and conductive layers and depositing a pillar material therein, wherein each pillar in the second set of pillars terminates in the source plate.

16 Claims, 11 Drawing Sheets

NAND FLASH BLOCK ARCHITECTURE ENHANCEMENT TO PREVENT BLOCK LIFTING

FIELD OF THE TECHNOLOGY

The disclosed embodiments relate to NAND Flash storage devices. In particular, at least some of the disclosed embodiments relate to 3D NAND Flash improvements.

BACKGROUND

Various types of non-volatile storage devices can be used to store data. Non-volatile storage devices can include NAND flash memory devices. NAND flash is a type of flash memory constructed using NAND logic gates. Alternatively, NOR flash is a type of flash memory constructed using NOR logic gates. Currently, the use of NAND flash predominates the flash market.

In typical flash memories, NAND or NOR transistors are used to store information and are arranged in arrays or grids of gates accessible via bit and word lines, the intersection of which is referred to as a cell. The simplest flash memories store one bit of information per cell and are referred to as single-level cell (SLC) flash memories. In a multi-level cell (MLC) flash, a cell stores more than one bit of information. Specifically, traditionally MLC flash has stored two bits of information per cell. Correspondingly, triple-level cell (TLC) flash stores three bits of information per cell, and a quad-level cell (QLC) flash stores four bits of information per cell.

Flash memory devices (e.g., NAND, NOR, etc.) have developed into a popular source of non-volatile memory for a wide range of electronic applications. Non-volatile memory is memory that can retain its data values for some extended period without the application of power. Flash memory devices typically use a one-transistor memory cell that allows for high memory densities, high reliability, and low power consumption. Changes in threshold voltage of the cells, through programming (which is sometimes referred to as writing) of charge-storage structures (e.g., floating gates or charge traps) or other physical phenomena (e.g., phase change or polarization), determine the data value of each cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

The array of memory cells for NAND flash memory devices is typically arranged such that the control gate of each memory cell of a row of the array is connected together to form an access line, such as a word line. Columns of the array include strings (often termed NAND strings) of memory cells connected together in series, source to drain, between a pair of select transistors (e.g., a source select transistor and a drain select transistor). Each source select transistor is connected to a source line, while each drain select transistor is connected to a data line, such as a column bit line. A column is a group of memory cells that are commonly coupled to a local data line, such as a local bit line. It does not require any particular orientation or linear relationship, but instead refers to the logical relationship between memory cell and data line.

To meet the demand for higher capacity memories, designers continue to strive for increasing memory density (e.g., the number of memory cells in a given area of an integrated circuit die). One way to increase the density of memory devices is to form stacked memory arrays (e.g., often referred to as three-dimensional memory arrays).

The memory cells at a common location (e.g., at a common vertical level) in a stacked memory array, for example, may form a tier of memory cells. The memory cells in each tier might be coupled to one or more access lines, such as local access lines (e.g., local word lines), that are in turn selectively coupled to drivers by transistors, such as pass transistors. In some examples, the memory cells in each tier can be commonly coupled to a common access line or plate.

One way of increasing memory density in non-volatile memory devices is to utilize vertical memory array (e.g., a three-dimensional (3D) memory array) architectures. A conventional vertical memory array includes semiconductor pillars extending through openings in tiers of conductive structures (e.g., word line tiers or plates, control gate tiers or plates) and insulating materials at each junction of the semiconductor pillars and the conductive structures. Such a configuration permits a greater number of switching devices (e.g., transistors) to be located in a unit of die area by building the array upwards (e.g., longitudinally, vertically) on a die, as compared to structures with conventional planar (e.g., two-dimensional) arrangements of transistors. Unfortunately, as the vertical height of these semiconductor pillars continues to increase, various defects during manufacturing arise. Notably, as the height of the semiconductor pillars increases the stack "lifts" off the underlying substrate, resulting in a defected wafer.

BRIEF DESCRIPTION OF THE DRAWINGS

The embodiments are illustrated by way of example and not limitation in the figures of the accompanying drawings in which like references indicate similar elements.

DETAILED DESCRIPTION

Generally, a 3D electronic device may be considered to be a device formed by a process that combines multiple levels of electronic devices (e.g., one device formed over another) using planar formations (e.g., multiple devices on a single level). Since multiple levels in 3D devices may use approximately the same area on a substrate, an overall density of devices (e.g., memory devices) can be increased in relation to the number of levels. Generally discussed herein are three-dimensional (3D) memories, memory cells, and methods of making and using the same.

As will be discussed, to prevent the lifting of a stack of conductive and insulating films (e.g., an ONON stack), the disclosed embodiments describe the use of "dummy" pillars that are etched in combination with active channel pillars. While active pillars terminate on a plug (e.g., a tungsten plug), the dummy pillars are etched deep into the silicon base substrate, thus strengthening the connection between the stack and the substrate. Alternatively, or in conjunction with the foregoing, the plugs below active pillars are partially inset into the substrate to increase skin friction and distribute the load of the pillar throughout the substrate.

Figure 1:
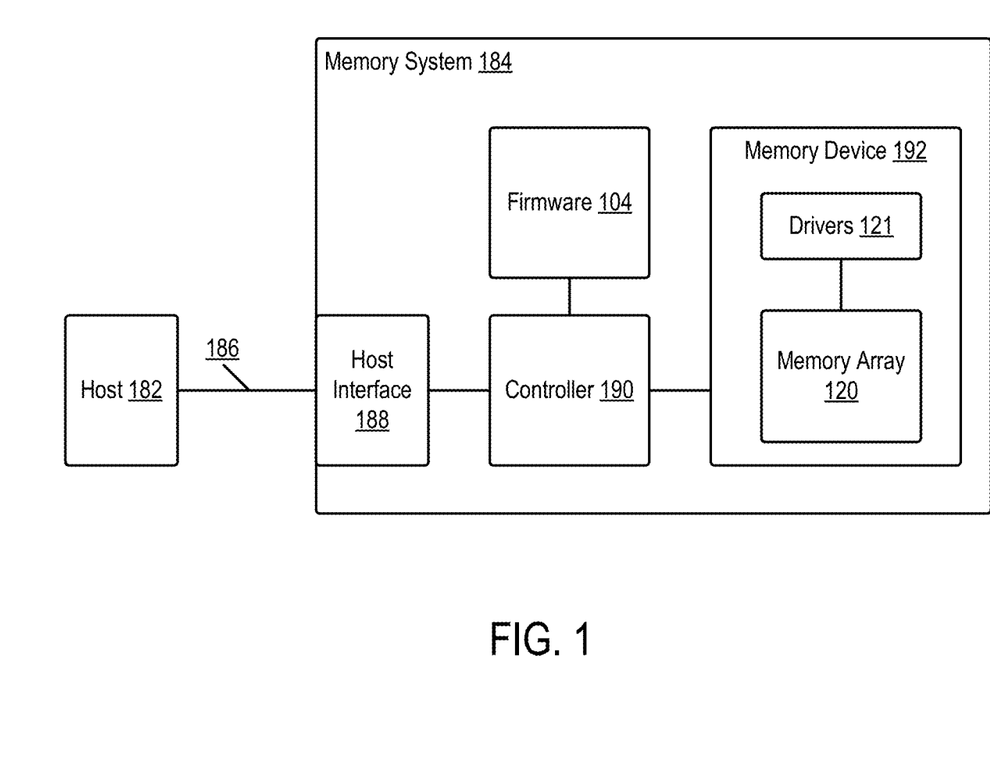
FIG. 1 illustrates a memory system having a controller that accesses data stored in a memory device, in accordance with some embodiments.

FIG. 1 illustrates a memory system 184 having a controller 190 that accesses data stored in a memory device 192, in accordance with some embodiments. In one example, memory array 120 a three-dimensional (3D) memory array. In some embodiments, multiple memory arrays 120 can be used.

Memory system 184 can be, for instance, a solid state drive (SSD), multimedia card (MMC), USB flash drive, compact flash card (CF), universal flash storage device (UFS), or other storage device, and can include a host interface 188, controller 190 (e.g., a processor and/or other control circuitry), and memory device 192 (e.g., solid state memory devices such as NAND flash devices), which provides a storage volume for the memory system 184. Memory device 192 can include one or more memory array(s) 120.

In a number of embodiments, the controller 190, the memory device 192, and/or the host interface 188 can be physically located on a single die or within a single package (e.g., a managed NAND application). In some embodiments, the controller 190, the memory device 192, and/or the host interface 188 are included in a stack of dice within a package. In one example, the stacked dice include through silicon vias for communicating power and signals to each die. In some embodiments, the controller 190, the memory device 192, and/or the host interface 188 are soldered to a printed circuit board (PCB). The controller 190, the memory device 192, and/or the host interface 188 can be packaged, for example, in a BGA module, M.2 module, mSATA module, slimSATA module, flash memory card, embedded USB card, small form factor (SFF) disk format (e.g., SFF-2.5, SFF-1.8, etc.), or other form-factor.

Memory device 192 includes drivers 121 that are used to apply signals to word-line tiers of memory array 120. In one embodiment, controller 190 accesses data stored in a first block of memory array 120 using a first word line. One of drivers 121, under control of controller 190, is used to access the data by applying a signal to the first word line. The word line signal is applied to corresponding tiers of the left block portion and right block portion of the first block. These two tiers logically correspond to the first word line. In one embodiment, each pair of corresponding tiers is connected by a conductive connector as described above.

The controller 190 can be coupled to the host interface 188 and to the memory device 192 via one or more channels and can be used to transfer data between the memory system 184 and a host 182. Host interface 188 can be in the form of a standardized interface. For example, when the memory system 184 is used for data storage in a computing system, the host interface 188 can be a serial advanced technology attachment (SATA), Serial Attached SCSI (SAS), peripheral component interconnect express (PCIe), or a universal serial bus (USB), among other connectors and interfaces. In general, however, host interface 188 can provide an interface for passing control, address, data, and other signals between the memory system 184 and host 182 (e.g., a host computing device having compatible receptors for the host interface 188).

Host 182 can be a host system such as a personal laptop computer, a desktop computer, a server, an embedded computer, a digital camera, a mobile telephone, a memory card reader, or other electronic device controlled by a processor, among various other types of hosts. Host 182 can include a system motherboard and/or backplane and can include a number of memory access devices (e.g., a number of processors). Host 182 can be coupled to the host interface 188 by a communication channel 186.

The controller 190 can communicate with the memory device 192 to control data read, write, and erase operations, among other operations, including equalization, discharge, and string driver operations. The controller 190 can include, for example, a number of components in the form of hardware and/or firmware (e.g., one or more integrated circuits), and/or software for controlling access to the memory device 192 and/or for facilitating data transfer between the host 182 and the memory device 192. In some embodiments, multiple memory devices can be used.

The memory device 192 can include a number of arrays of memory cells. The arrays can be flash arrays with a NAND architecture, for example. However, embodiments are not limited to a particular type of memory array or array architecture. The memory cells can be grouped, for instance, into a number of blocks including a number of physical pages. A number of blocks can be included in a plane of memory cells, and an array can include a number of planes.

In some embodiments, host 182 can be a computer (e.g., mobile phone or other computing device) having one or more central processing units (CPUs) to which computer peripheral devices, such as the memory system 184, may be attached via an interconnect, such as a computer bus.

The memory system 184 can be used to store data for the host 182. Examples of memory system 184 include solid state drives, USB flash drives, multimedia cards (MMC), compact flash cards (CF), universal flash storage devices (UFS), memory cards, flash memory, or other memory devices.

Controller 190 can run firmware 104 to perform operations responsive to the communications from the host 182. Firmware in general is a type of computer program that provides control, monitoring, and data manipulation of engineered computing devices. In FIG. 1, the firmware 104 controls the operations of the controller 190 in operating the memory system 184, such as translating a logical address to a physical address for storing and accessing data in the memory device 192. In one example, the controller 190 is an internal controller of a managed NAND device that stores data in TLC NAND flash memory.

An example of non-volatile storage media used in memory array 120 is memory cells (e.g., SLC, TLC, QLC) in an integrated circuit. The storage media is non-volatile in that no power is required to maintain the data/information stored in the non-volatile storage media, which data/information can be retrieved after the non-volatile storage media is powered off and then powered on again. The memory cells may be implemented using various memory types, such as NAND gate based flash memory, phase-change memory (PCM), magnetic memory (MRAM), resistive random-access memory, and 3D XPoint, such that the storage media is non-volatile and can retain data stored therein without power for days, months, and/or years.

In one embodiment, during operation, controller 109 receives various commands from host 182. These commands can include a read command or a write command. In one example, a read command includes a logical address, and is received from host 182 to access stored data in non-volatile storage media of memory array 120.

In one example, controller 190 receives a logical address and determines a physical address. The physical address that is determined is used to read that portion of stored data that corresponds to the received logical address. Controller 190 then sends the read data to host 182. In some instances, the controller 190 has multiple processors, each having its own in-processor cache memory.

The memory system 184 can be used in various computing systems, such as a cloud computing system, an edge computing system, a fog computing system, and/or a standalone computer. In a cloud computing system, remote computer servers are connected in a network to store, manage, and process data. An edge computing system optimizes cloud computing by performing data processing at the edge of the computer network that is close to the data source and thus reduces data communications with a centralize server and/or data storage.

At least some embodiments of the disclosures herein can be implemented using computer instructions executed by the controller 190, such as the firmware 104. In some instances, hardware circuits can be used to implement at least some of the functions of the firmware 104. The firmware 104 can be initially stored in the non-volatile storage media of memory array 120, or another non-volatile device, and loaded into volatile memory (not shown) and/or in-processor cache memory for execution by the controller 190.

A non-transitory computer storage medium can be used to store instructions of the firmware 104. When the instructions are executed by the controller 190 of the memory system 184, the instructions cause the controller 190 or other processing device(s) to perform methods as discussed herein.

In one embodiment, a local manager (not shown) of memory system 184 receives data access commands. A data access request (e.g., read, write) from the host 182 identifies an LBA address to read, write, or erase data from a memory unit identified by the LBA address. The local manager translates the logical address to a physical address.

In one embodiment, a controller is implemented by one or more processing devices. The processing device can be, for example, a microprocessor, a central processing unit (CPU), a processing core of a processor, an execution unit, an embedded processor, an embedded controller, a graphics processor, etc. The processing device can be, for example, a microcontroller, special purpose logic circuitry (e.g., a field programmable gate array (FPGA), an application specific integrated circuit (ASIC), a system on a chip (SOC), etc.), or another suitable processor. The processing device may be composed of a single processor with a single processing core, a single processor with multiple processing cores, or multiple processors.

In some embodiments, the controller includes a host I/O management component, a flash translation layer (FTL), and a memory unit management component.

In embodiments in which the memory (e.g., non-volatile storage media) includes a number of arrays of memory cells, the arrays can be flash arrays with a NAND architecture, for example. However, embodiments are not limited to a particular type of memory array or array architecture. The memory cells can be grouped, for instance, into a number of blocks, which are erased together as a group and can store a number of pages of data per block. A number of blocks can be included in a plane of memory cells and an array can include a number of planes. As used herein, a "page of data" refers to an amount of data that the controller is configured to write/read to/from the non-volatile storage media as part of a single write/read operation and can be referred to as a "flash page". As an example, a memory device may have a page size of 8 KB (kilobytes) and may be configured to store 128 pages of data per block, 2048 blocks per plane, and 16 planes per device.

Unlike with traditional hard disk drives, data stored in flash arrays cannot be directly overwritten. That is, a block of flash cells must be erased prior to rewriting data thereto (e.g., a page at a time). In some embodiments, the controller can manage data transferred between the host processor and the flash arrays via a logical-to-physical mapping scheme. For instance, a flash translation layer can employ a logical addressing scheme (e.g., logical block addressing (LBA)). As an example, when new data received from the host processor is to replace older data already written to the flash array, the controller can write the new data in a new location on the non-volatile storage media and the logical-to-physical mapping of the FTL can be updated such that the corresponding logical address(es) associated with the new data being written indicates (e.g., points to) the new physical location. The old location, which no longer stores valid data, will be erased prior to being written again.

Figure 2A:
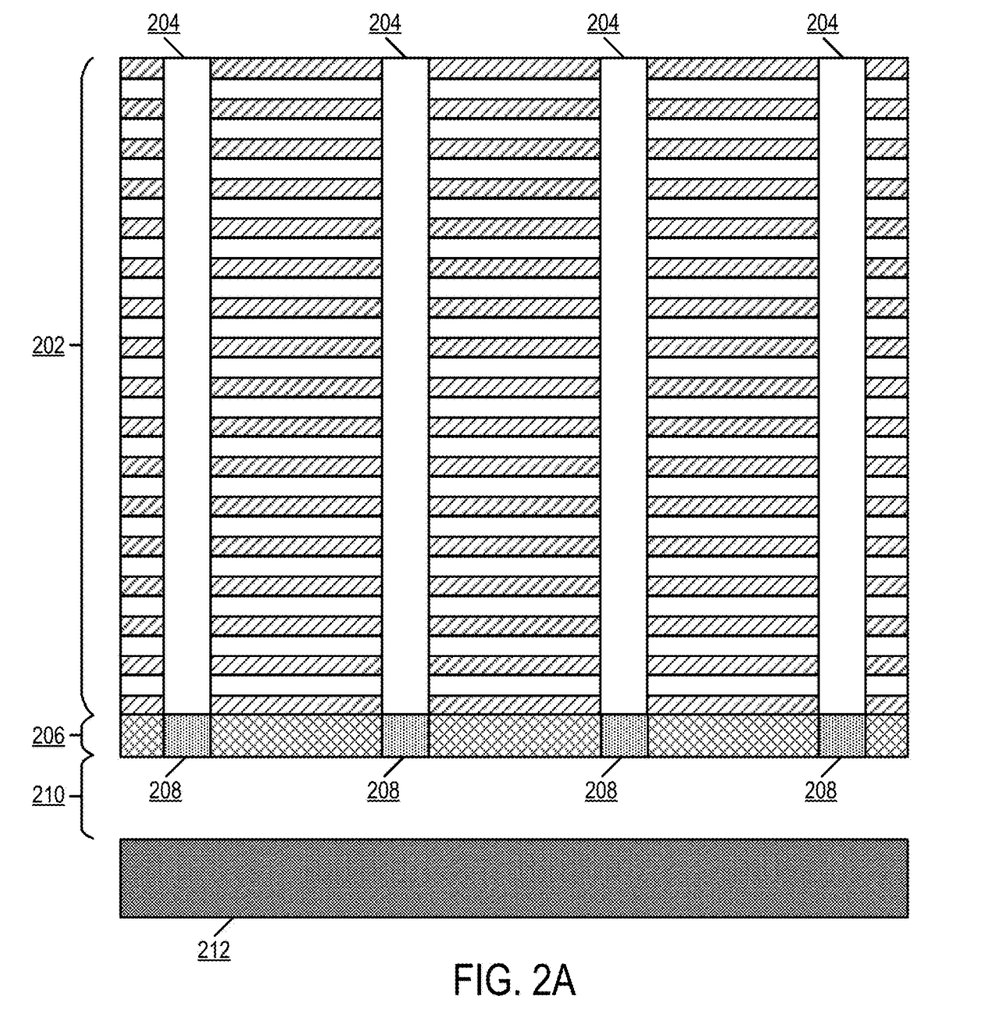
FIG. 2A a block diagram illustrating a 3D NAND memory exhibiting block lifting according to some embodiments of the disclosure.

FIG. 2A is a diagram illustrating a memory exhibiting block lifting according to some embodiments of the disclosure.

In the illustrated embodiment, an alternating stack of conductive and insulating materials (202) is situated above a source plate (212) and a silicon oxide layer (206). In one embodiment, the stack (202) comprises a stack of memory cells having a plurality of charge storage structures (e.g., floating gates, charge traps or the like), a stack of alternating control gates and insulating or insulating materials, and charge blocking materials disposed between the charge storage structures (mostly referred to by example as floating gates hereinafter) and the adjacent control gates. An oxide material, such as silicon oxide, is conventionally used as the insulating material. The charge blocking material may be an inter-poly insulating (IPD) material, such as oxide-nitride-oxide (ONO) material.

In the illustrated embodiment, a plurality of pillars (204) are etched into the stack (202) terminating at a respective plug (208). In the illustrated embodiment, the pillars (204) extend into the stack (202) from the upper portion of the stack (202) to a level adjacent to the upper surface of the silicon oxide layer (206). Each of the pillars (204) may have a high aspect ratio. An aspect ratio of a pillar is defined as a ratio of a depth of the opening to a diameter of the opening. For example, the depth (e.g., the length) of an opening of a pillar may be about 2 μm, and the diameter of the opening of a pillar may be about 60-100 nm. In some embodiments, the opening of a pillar may have an isolation liner (not illustrated) formed (e.g., deposited) on an inside wall of the pillar. Therefore, the high aspect ratio of the opening may be e.g., between about 20 and 33. In some embodiments, the isolation liner may include oxide material or nitride material.

In the illustrated embodiment, the silicon oxide layer (206) on the bottom of stack (202) includes a plurality of plugs (e.g., tungsten plugs) (208). In the illustrated embodiment, the plugs (208) function as an etch-landing layer to stop further etch during a process of forming the device, and may also function as a conductive contact to provide an electrical contact between a poly-silicon channel formed in the stack (202) and a subsequent poly-silicon channel in the stack (202) when the device is operating.

In the illustrated embodiment, an air gap (210) exists between the silicon oxide layer (206) and the source plate (212). In the illustrated embodiment, this gap (210) is generating during the manufacturing of the memory wafer. Specifically, when the number of alternating layers of the stack (202) is increased, a punch etch procedure (or similar etching procedure) used to connect the pillars to the substrate and/or source plate (212) is unable to reach the substrate and/or source plate (212), which results in pillars that are lifted off the substrate and/or source plate (212). When lifted from the substrate and/or source plate (212), the transistors formed in the pillars (204) are inoperable. In addition, the placement of plugs (208) in FIG. 2a, even when not "lifted" from the substrate and/or source plate (212) exhibit negative stress characteristics around the plugs (208), which are described briefly below in connection with FIGS. 2B and 2C.

Figure 2B:
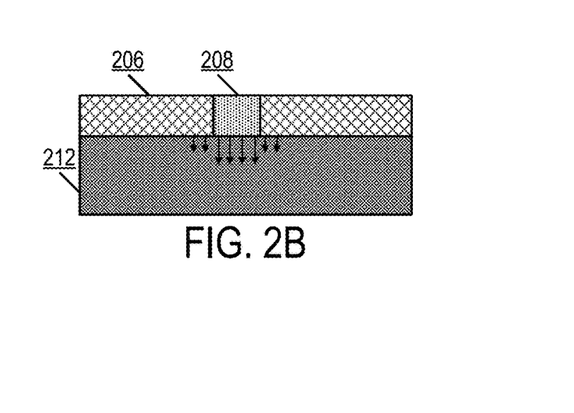
FIGS. 2B and 2C are block diagrams illustrating stress distributions on a tungsten plug flush with a silicon oxide base layer according to some embodiments of the disclosure.
Figure 2C:
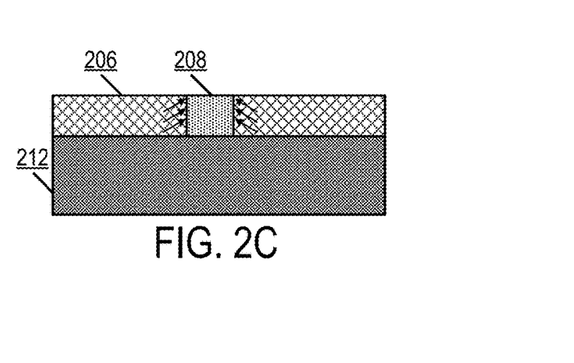

As illustrated in FIG. 2B, the stress distribution is terminated at the end of the pillar and distributed directly at the interface of the silicon oxide layer (206) and the substrate and/or source plate (212). Additionally, as depicted in FIG. 2C, skin friction is exerted from the surrounding silicon oxide layer (206) on the plug (208) itself. In addition to the foregoing, the stress distribution of the plugs (208) also contributes to the lifting of the ONON stack (202) from the source plate (212). FIGS. 2B and 2C are block diagrams illustrating stress distributions on a tungsten plug flush with a silicon oxide base layer according to some embodiments of the disclosure. As illustrated in FIG. 2B, the stress of the pillar (208) is terminated at the end of the pillar and distributed directly on the upper surface of the silicon oxide layer (206). Additionally, some stress is perpendicularly deposited on the surfaces of the silicon oxide layer (206) surrounding the plug (208). Additionally, as depicted in FIG. 2C, skin friction pressure is exerted from the surrounding silicon oxide layer (206) and on the plug (208) itself. The result is a net force pushing the plug (208) and silicon oxide layer (206) away from the source plate (212).

FIG. 3A through 3G are cross-sectional views illustrating a fabrication process for creating a semiconductor device. The specific number of steps illustrated in FIGS. 3A through 3G are exemplary and more steps may be employed as will be discussed.

Figure 3A:
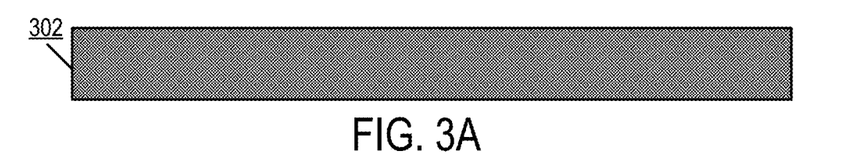
FIGS. 3A through 3G illustrate a fabrication process for creating a semiconductor device according to some embodiments of the disclosure.

FIG. 3A illustrates a source plate (302). In the illustrated embodiment, source plate (302) comprises a silicon substrate and one or more fabricated layers forming a source gate for a string of transistor elements.

The source plate (302) comprises a silicon substrate that undergoes various fabrication processes to form the source lines. The specific steps used to form the source lines are not intended to be limiting. As an example, in some embodiments, a layer of tungsten silicide (WSix) may be deposited on top of the source plate (302). Next, a layer of polysilicon may be deposited on top of the WSix. Then a photoresist may be layered on top of the polysilicon. The WSix and polysilicon may then be dry- or wet-etched using the photoresist to form the source lines in the source plate (302). In general, any fabrication technique known in the art used to generate select gates (SGS) may be employed in the source plate (302) fabrication. Notably, the embodiment in FIG. 3A does not explicitly illustrate the various layers of, for example, polysilicon or WSix used to form source lines.

Figure 3B:
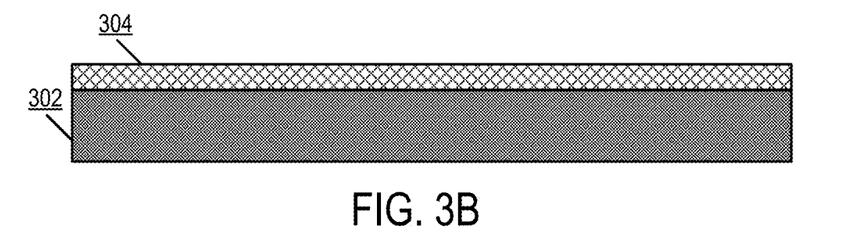

In FIG. 3B, a layer of silicon oxide (304) is next deposited on the fully formed source plate (302). In some embodiments, the silicon oxide layer (304) is formed using tetraethyl orthosilicate (TEOS) deposition.

Figure 3C:
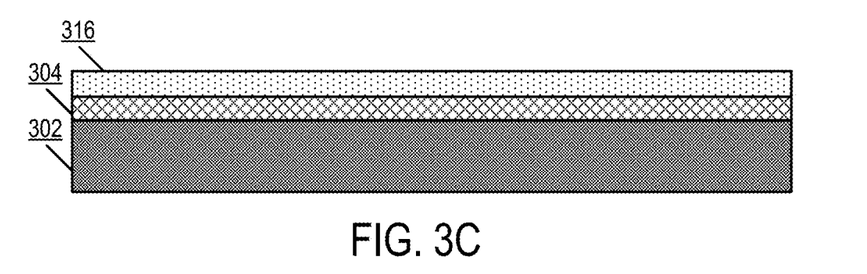

In FIG. 3C, a photoresist layer (316) is deposited on top of the silicon oxide layer (304). The photoresist layer (316) may comprise a photopolymeric, photodecomposing, photocrosslinking photoresist or other suitable photoresist. In FIG. 3C, a mask pattern is placed on top of the photoresist layer. As will be discussed, the mark is patterned to produce a plurality of holes spaced throughout the photoresist.

Figure 3D:
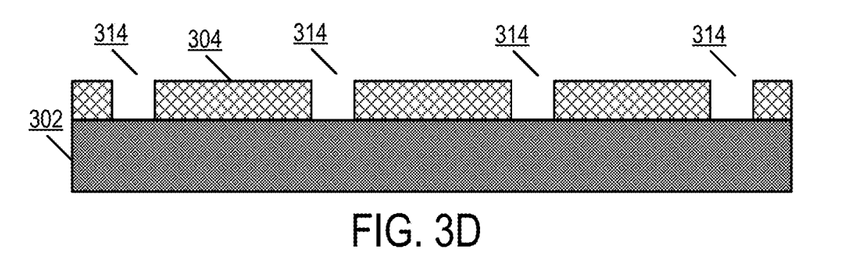

Next, in FIG. 3D, a plurality of "holes" (314) are formed into the silicon oxide layer (304) via the photoresist (316). Notably, the photolithography used in FIGS. 3C and 3D is configured to only etch plugs below where active columns of the 3D NAND array will be present.

Figure 3E:
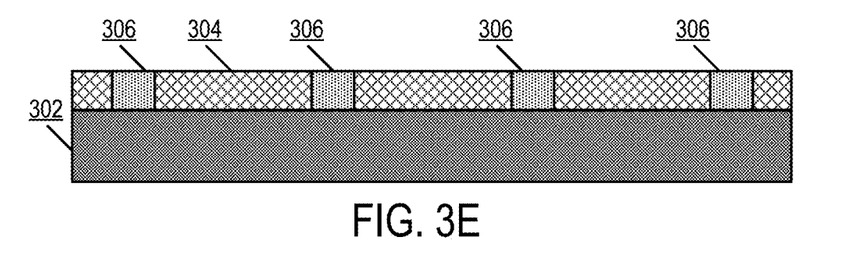

In FIG. 3E, after etching the plug locations (314), tungsten (W) is used to fill the etched cavities, forming plugs (306). In some embodiments, tungsten plug chemical mechanical polishing (WCMP) may additionally be applied after forming the tungsten plugs. In some embodiments, conductive materials other than tungsten may be employed.

At the conclusion of the processing stage depicted in FIG. 3E, a plurality of plugs (306) are formed on the source plate (302), each plug (306) positioned below an active pillar of the resulting 3D NAND devices.

Figure 3F:
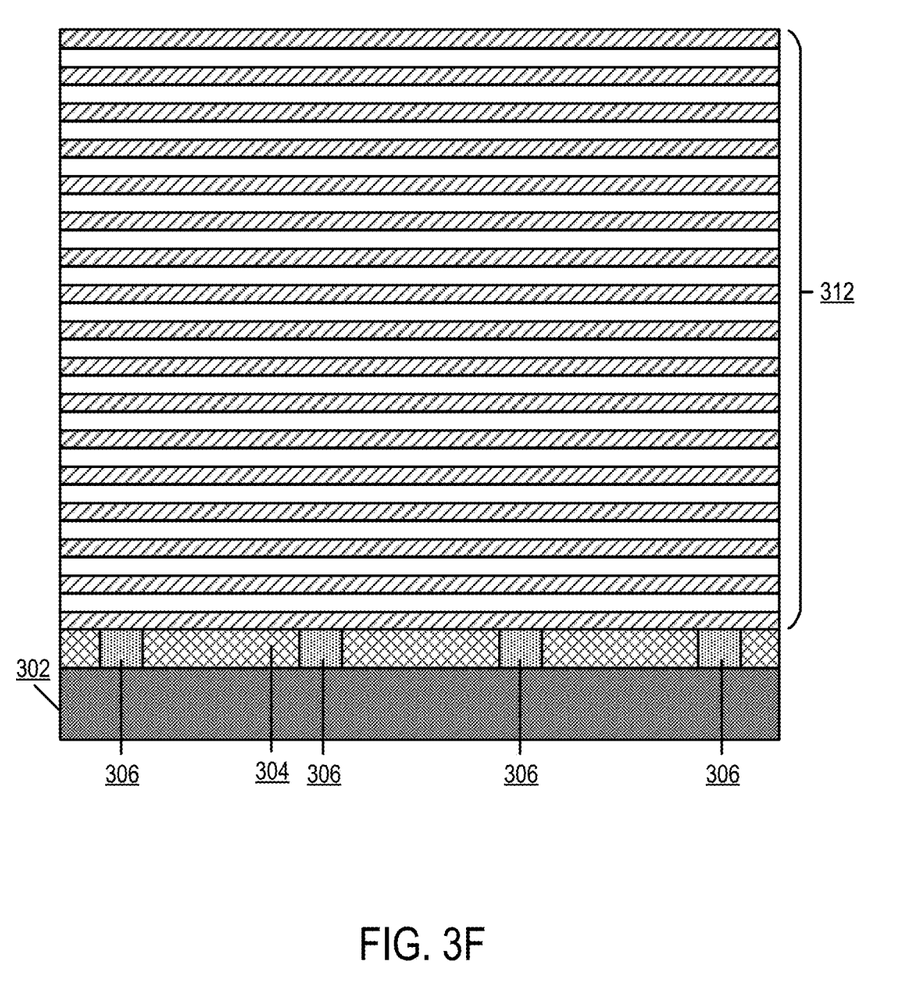

In FIG. 3F, a plurality of conductive and insulating layers are deposited atop the silicon oxide layer (304) to form a stack (312). In one embodiment, the conductive layers comprise silicon nitride layers and the insulating layers comprise silicon oxide layers. In the illustrated embodiment, a first insulating layer is deposited on the silicon oxide layer (304), followed by a second conductive layer, followed by a second insulating layer, etc. In some embodiments, alternating layers of silicon oxide and silicon nitride are referred to as an "ONON" stack. As known in the art, the ONON stack (312) can be used to form individual memory cells or transistors via a punch etch or tunnel etch.

Figure 3G:
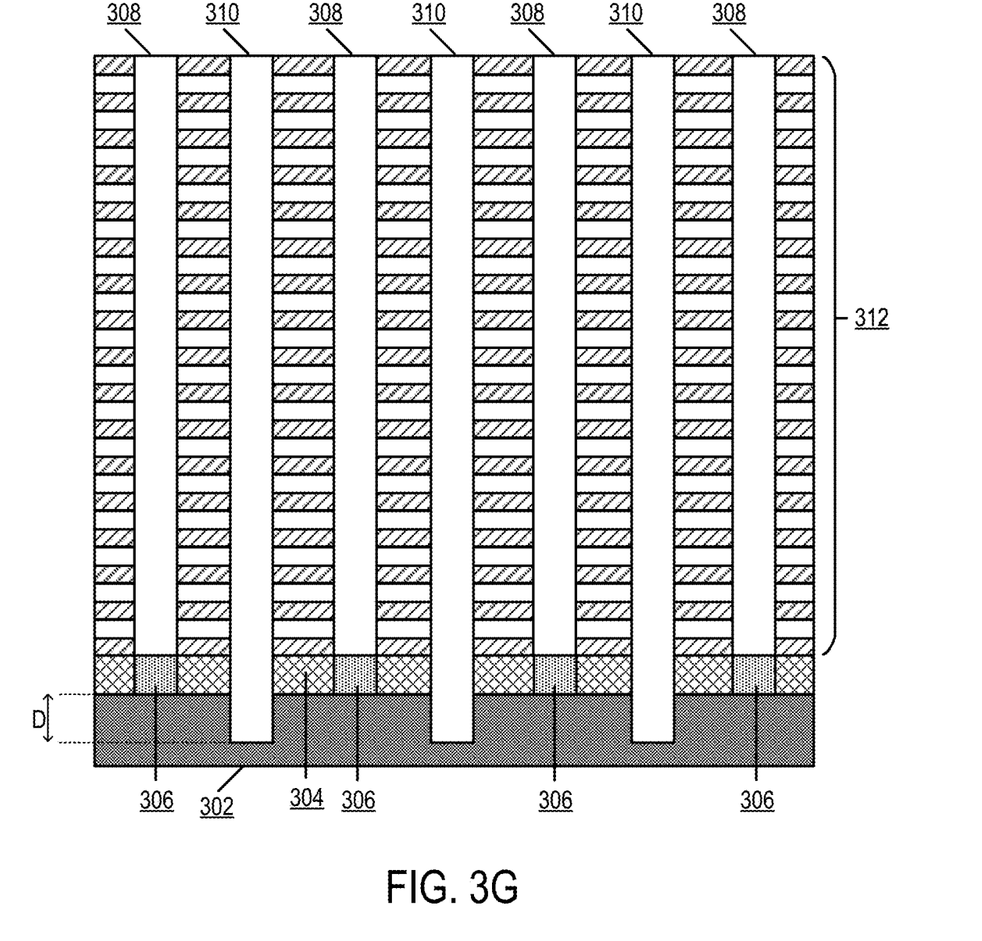

In FIG. 3G, after depositing the stack (312), multiple pillars (308, 310) are etched into the stack (312). In one embodiment, a hard mask is deposited on the top of the stack (312). In some embodiments, the hard mask comprises a pillar pattern (illustrated in more detail in FIG. 4). In general, the pillar pattern defines a plurality of circular openings where pillars (308, 310) are located. In some embodiments, the pillar openings are separated by larger gaps which form the gaps between sub-blocks of the transistor matrix.

Once the hardmask is applied, a high aspect ratio (HAR) etch is performed to etch the pillars (308, 310) into the stack (312). In some embodiments, the conductive (e.g., nitride) layers of the stack may be removed and a tungsten is applied via an inside-out tungsten deposition process. If the nitride layers of an ONON stack are removed in this manner, an OWOW stack may be used in lieu of an ONON stack.

In the illustrated embodiment, in contrast to existing etches, the embodiment includes additional "dummy" pillars (310). In the illustrated embodiment, a first set of pillars (308) is etched and terminates at respective plugs (306). In the illustrated embodiment, the plugs (306) comprise tungsten plugs. In contrast, dummy pillars (310) terminate deep in the source plate (302). In the illustrated embodiment, the dummy pillars (310) terminate at a distance D from the upper surface of the source plate. Since the dummy pillars (310) are not positioned above the plugs (306), the HAR etch penetrates through the stack (312) and partially into the source plate (302). In contrast, the use of the tungsten plugs (306) prevents the higher power HAR etch from penetrating into the substrate, thus forming the saw-toothed pillar formation depicted in FIG. 3G.

In subsequent steps, dummy pillars (310) are further formed identical to the active pillars (308). That is, in some embodiments, both sets of pillars (308, 310) are lined with a polysilicon coating and subsequently filled with silicon dioxide. However, since the dummy pillars (310) are not used for storing information, the dummy pillars to not affect the operation of the active pillars (308).

Each of the materials described herein may be applied, deposited, or otherwise formed according to techniques and methods known independently in the art. The techniques and methods can include one or more deposition activities, such as chemical vapor deposition (CVD), atomic level deposition (ALD), physical vapor deposition (PVD), or other techniques. Forming multiple materials in various levels may be accomplished via stacked deposition operations.

Although the process acts and operations described herein may refer to particular conductor, semiconductor, or insulating materials, such as silicon, silicon dioxide, silicon nitride, or others, a person of ordinary skill in the art and familiar with this disclosure will recognize that other conductor, semiconductor, and insulating materials may be substituted and still be within a scope of the disclosed subject matter. Thus, the material choices and selections presented are merely provided as an aid in understanding one example of a fabrication process.

For example, various types of semiconductor materials, (e.g., single-crystal or amorphous silicon, germanium, other elemental semiconductor materials, compound semiconductor materials, etc.) may be used as an alternative for or in conjunction with other types of semiconductor material. Additionally, various types of insulating materials, such as tantalum pentoxide ($Ta_2O_5$), silicon nitride ($Si_xN_y$), aluminum oxide ($Al_2O_3$), hafnium oxide ($HfO_2$), and a variety of other organic or inorganic insulating materials, may be used as an alternative to or in conjunction with others of the materials described. Also, various other combinations of materials may also be substituted or included. For example, in certain applications, described semiconductor materials may be substituted with conductor materials including, for example, silver (Ag), copper (Cu), Aluminum (Al), zinc (Zn), platinum (Pt), tungsten (W), titanium (Ti), or tantalum (Ta).

Further, various formation, process, and other discussions that follow may refer to one material placed, for example, "over," "above," or "atop" another material. Such descriptors are relative terms only and obviously depend upon an exact orientation of any resulting device. However, a person of ordinary skill in the art will readily understand the context of such relative terms upon reading and understanding the disclosure provided herein in conjunction with the respective drawings.

Figure 4A:
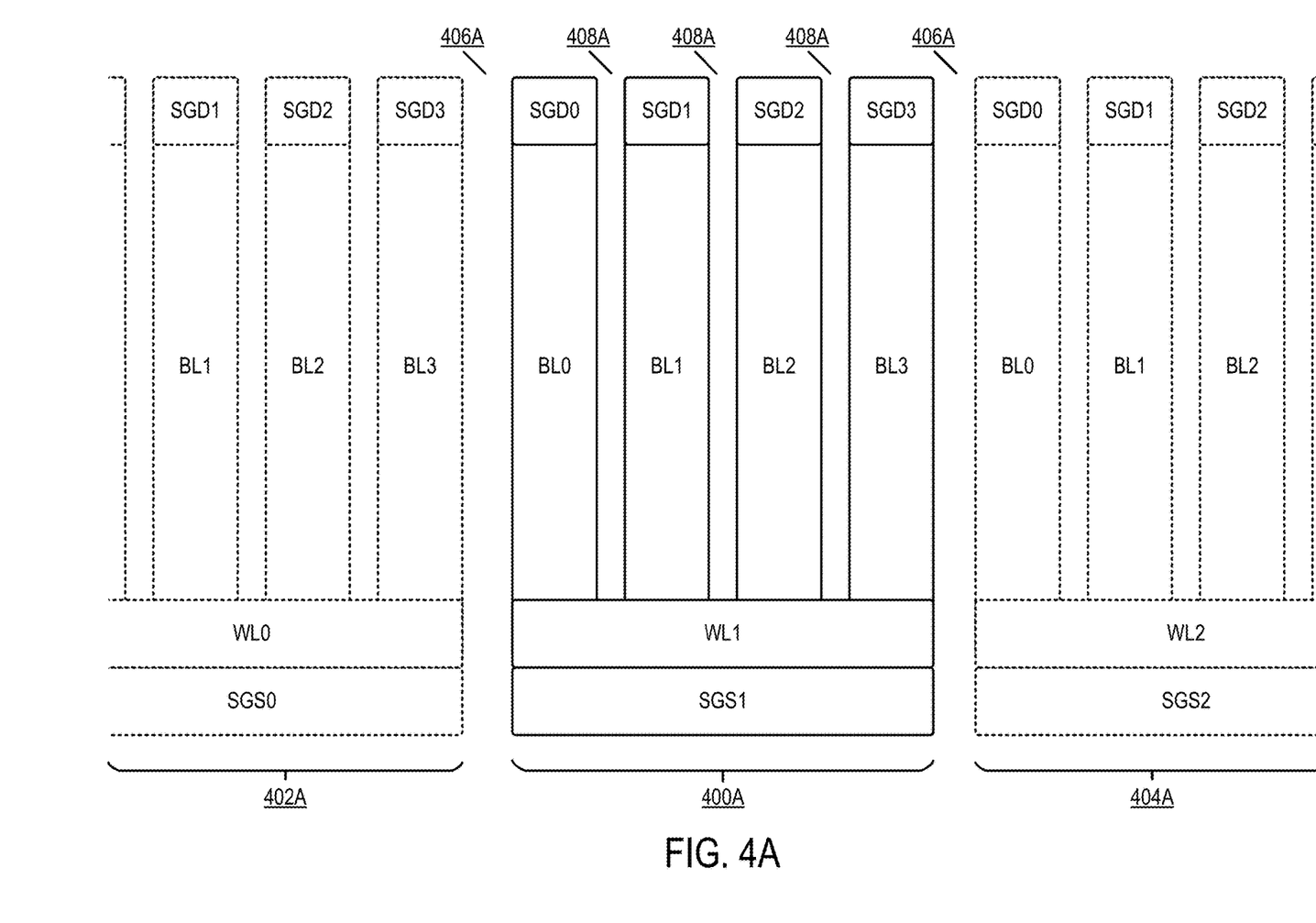
FIG. 4A is a logical view of a memory block according to some embodiments of the disclosure.

FIG. 4A is a logical view of a memory block according to some embodiments of the disclosure. In the illustrated embodiment, the view presented in FIG. 4A comprises a cross-sectional view of a memory block.

In the illustrated embodiment, a given memory block (400a) is situated in series with a plurality of other memory blocks (402a, 404a). The memory blocks (400a, 402a, 404b) are substantially similar in design.

A given memory block (400a) includes a plurality of bit lines (BL0-BL3). The specific number of bitlines is not intended to be limiting. In the illustrated embodiment, the bit lines are formed via stacks of conductive-insulating layers as described in FIGS. 3A through 3G and 5A through 5G. In the illustrated embodiment, a source plate of a given block (400a) includes a shared select gate source (SGS1) and a write line (WL1). As illustrated, a plurality of bit lines share a single SGS in contrast to memories where each bit line includes a dedicated SGS and WL transistor structure. Thus, the block (400a) comprises a "merged block" wherein a single SGS layer controls access to a plurality of bitlines (BL0-BL3). As in existing memories, write line WL1 enables writing to transistors cormed in the bitlines (BL0-BL3). Additionally, as illustrated, each bit line (BL0-BL3) has a dedicated select gate drain (SGD0-SGD3) transistor to enable output of the bitlines (BL0-BL3) to a word line.

In the illustrated embodiment, each bitline (BL0-BL3) comprises a plurality of vertically formed transistor elements. As described previously, these bitlines may be formed by layering conductive and insulating materials and etching transistors via a pillar etch. Details of this fabrication process are described previously and not repeated herein.

In the illustrated embodiment, blocks (400a, 402a, 404a) are separated to form logical divisions of memory cells. In the illustrated embodiment, the blocks (400a, 402a, 404a) are separated by slots (406a). In one embodiment, these slots comprise an un-etched conductive-insulating stack. For example, turning to FIG. 3F, the stack (312) may simply not be etched to provide segmentation between memory blocks.

By contrast, individual bitlines (BL0-BL3) are separated by slits (408a). In one embodiment, the slits (408a) correspond to pillars (310). In the illustrated embodiment, the slits (408a) are formed via a punch etch at the same time the pillars used to form transistors in a given bitline are formed. However, the aforementioned plug layer is used to vary the depths of the pillars during formation. Details of this fabrication process have been described and are described more herein.

Figure 4B:
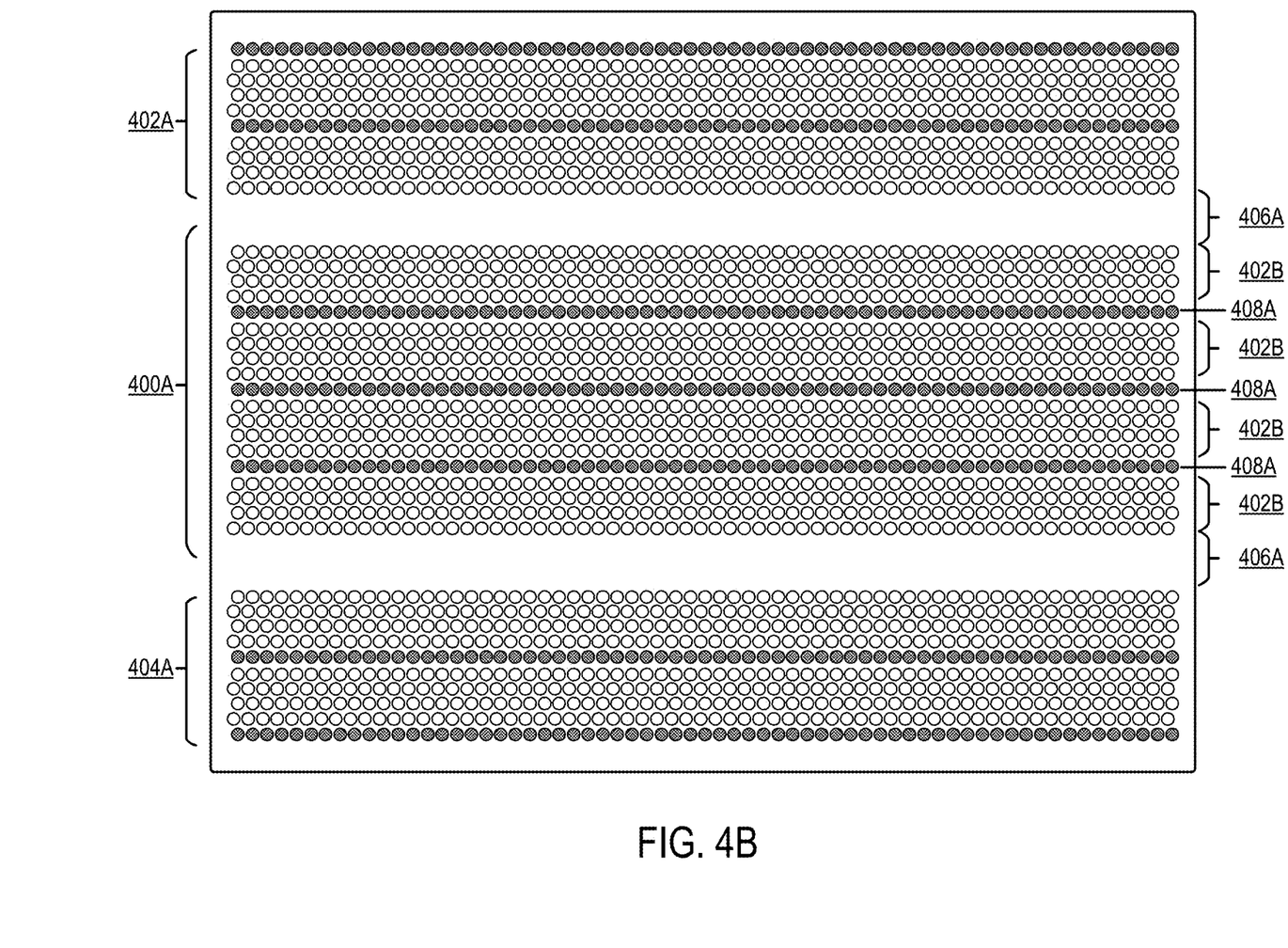
FIG. 4B is a top-down view of a portion of a semiconductor device according to some embodiments of the disclosure.

FIG. 4B is a top-down view of a portion of a semiconductor structure according to some embodiments of the disclosure. In the illustrated embodiment, FIG. 4B provides a top down view of a larger surface area that includes the cross-sectional memory blocks of FIG. 4A.

In the illustrated embodiment, a single block (400a) (e.g., merged block of FIG. 4A) of bitlines (402b) is depicted while portions of other blocks (402a, 404a) are partially depicted. The block (400a) is separated from other blocks via slots (406a). Slits (408a) provide column-separation between bitlines (402b) of a merged block (400a).

As described in the process depicted in FIGS. 3A through 3G, channel columns are etched through a stack of conductive-insulating layers to form bitlines (402b). As discussed, each of these columns terminates on a plug formed atop the a source plate. In contrast, interleaved sets of dummy pillars (408a) are etched deep into the substrate and do not terminate on a plug.

FIG. 5A through 5D illustrate a fabrication process for creating a 3D NAND Flash memory.

Figure 5A:
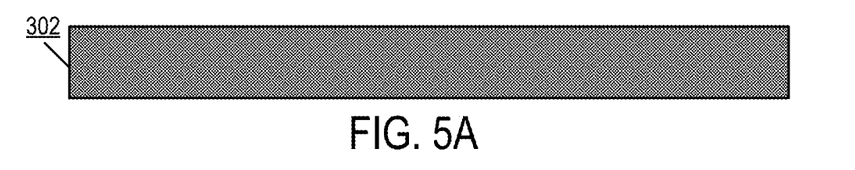
FIG. 5A through 5G illustrate a fabrication process for creating a semiconductor device according to some embodiments of the disclosure.

FIG. 5A illustrates a source plate (302). In the illustrated embodiment, source plate (302) comprises a silicon substrate and one or more fabricated layers forming a source gate for a string of transistor elements. The source plate (302) comprises a silicon substrate that undergoes various fabrication processes to form the source lines. The specific steps used to form the source lines are not intended to be limiting. As an example, in some embodiments, a layer of tungsten silicide (WSix) may be deposited on top of the source plate (302). Next, a layer of polysilicon may be deposited on top of the WSix. Then a photoresist may be layered on top of the polysilicon. The WSix and polysilicon may then be etched using the photoresist to form the source lines in the source plate (302). In general, any fabrication technique known in the art used to generate select gates (SGS) may be employed in the source plate (302) fabrication. Notably, the embodiment in FIG. 3A does not explicitly illustrate the various layers of, for example, polysilicon or WSix used to form source lines.

Figure 5B:
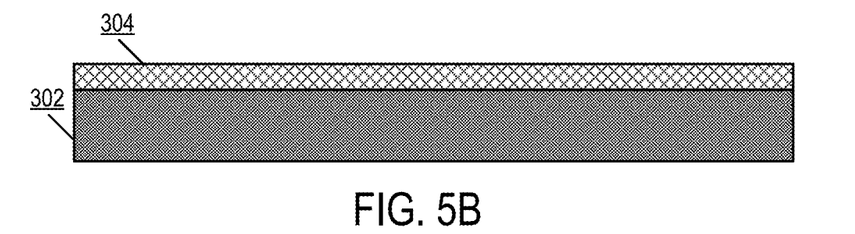

In FIG. 5B, a layer of silicon oxide (304) is deposited on the fully formed source plate (302). In some embodiments, the silicon oxide layer (304) is formed using tetraethyl orthosilicate (TEOS) deposition.

Figure 5C:
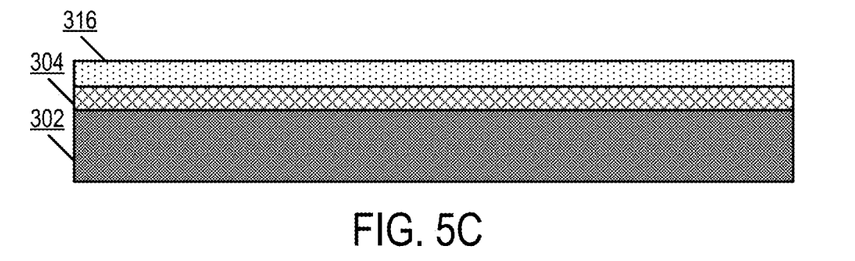

In FIG. 5c, a photoresist layer (316) is deposited on top of the silicon oxide layer (304). The photoresist layer (316) may comprise a photopolymeric, photodecomposing, photocrosslinking photoresist or other suitable photoresist. In FIG. 3C, a mask pattern is placed on top of the photoresist layer. As will be discussed, the mark is patterned to produce a plurality of holes spaced throughout the photoresist.

Figure 5D:
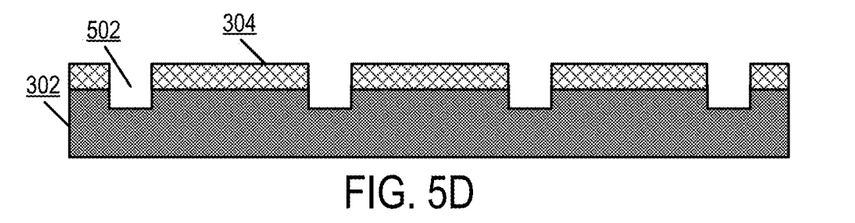

Next, a plurality of "holes" are etched into the silicon oxide layer (304) and into the source plate (302) via the photoresist patterning and via dry etch processing. These holes (502) are situated where plugs (506) are illustrated. Notably, in one embodiment, the photolithography used in this sub-stage is configured to only etch plugs below where active columns of the 3D NAND array will be present.

Figure 5E:
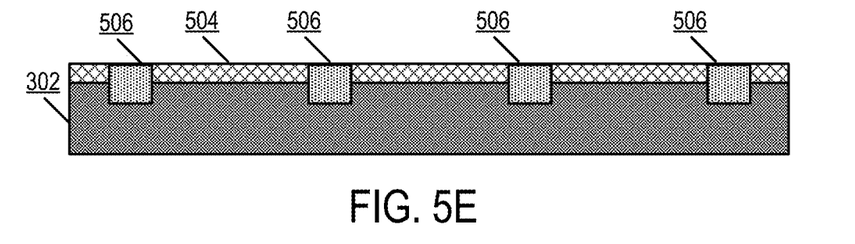

In FIG. 5E, after etching the plug locations, in the next stage illustrated in FIG. 5C, tungsten is used to fill the etched cavities, forming plugs (506). In some embodiments, tungsten plug chemical mechanical polishing (WCMP) may additionally be applied after forming the tungsten plugs. In some embodiments, conductive materials other than tungsten may be employed.

Figure 5F:
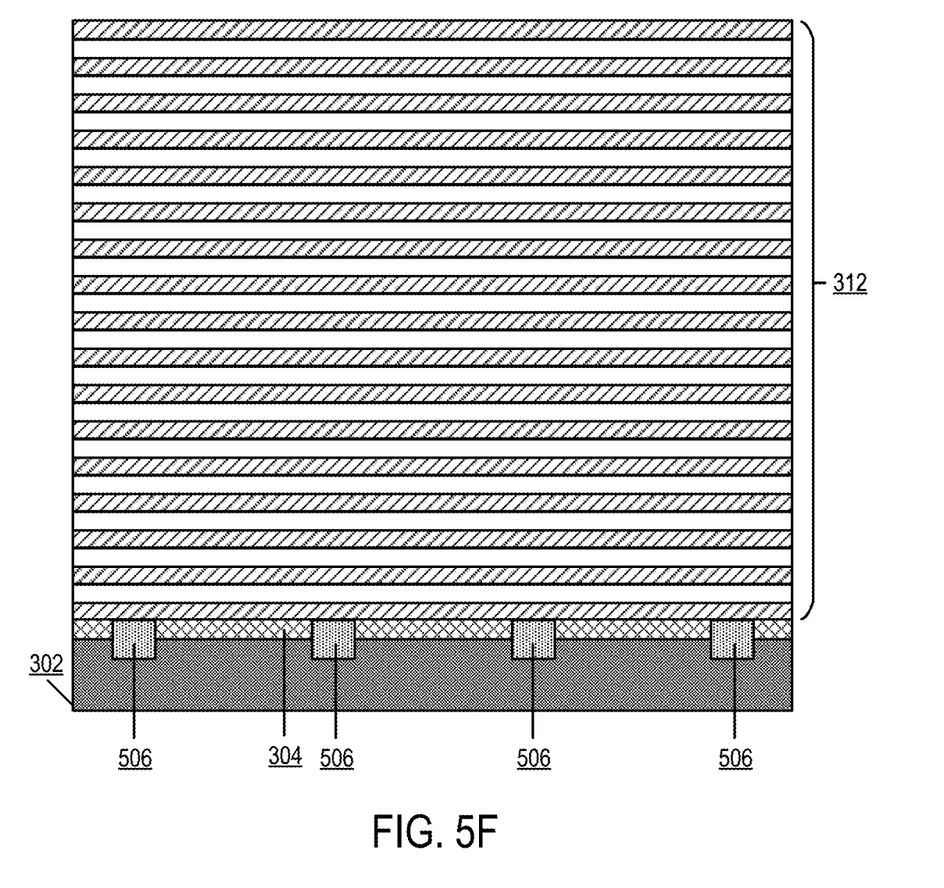

In FIG. 5F, a plurality of conductive and insulating layers are deposited atop the silicon oxide layer (304) to form a stack (312). In one embodiment, the conductive layers comprise silicon nitride layers and the insulating layers comprise silicon oxide layers. In the illustrated embodiment, a first insulating layer is deposited on the silicon oxide layer (304), followed by a second conductive layer, followed by a second insulating layer, etc. In some embodiments, alternating layers of silicon oxide and silicon nitride are referred to as an "ONON" stack. As known in the art, the ONON stack (312) can be used to form individual memory cells or transistors via a punch etch or tunnel etch.

Figure 5G:
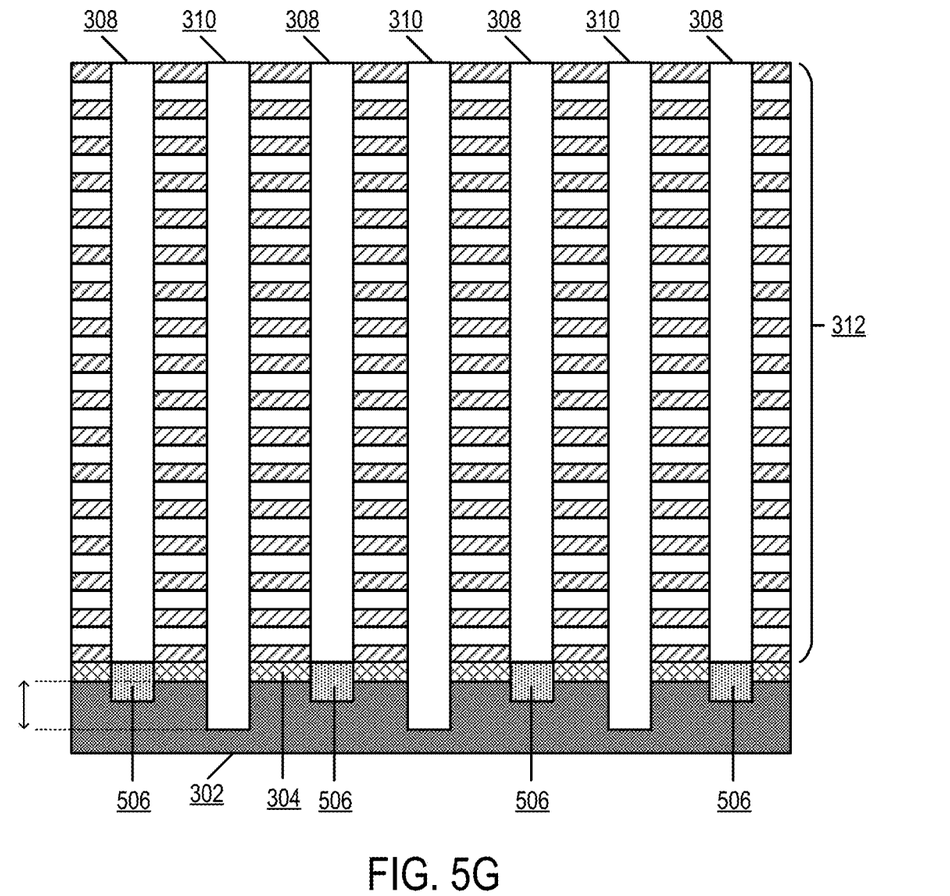

Finally, in FIG. 5G, the stack (312) and pillars (308, 310) are etched. In the illustrated embodiment, this process is performed as described in FIG. 3G and that discussion is not repeated herein. As noted, however, the active pillars (308) are situated on the partially inset plugs (506). As described in the discussion of FIGS. 6A and 6B, this partially inset plug design may be optional, which moves the stress distribution path at the end of the pillars from the interface of the silicon oxide layer (304) and the substrate and/or source plate (302) into the substrate and/or source plate (302) and prevent lifting in combination with the dummy pillars. Further, in some embodiments, dummy pillars may not be used at all and only the partially inset plugs may be used to strengthen the active pillars.

Each of the materials described herein may be applied, deposited, or otherwise formed according to techniques and methods known independently in the art. The techniques and methods can include one or more deposition activities, such as chemical vapor deposition (CVD), atomic level deposition (ALD), physical vapor deposition (PVD), or other techniques. Forming multiple materials in various levels may be accomplished via stacked deposition operations.

Although the process acts and operations described herein may refer to particular conductor, semiconductor, or insulating materials, such as silicon, silicon dioxide, silicon nitride, or others, a person of ordinary skill in the art and familiar with this disclosure will recognize that other conductor, semiconductor, and insulating materials may be substituted and still be within a scope of the disclosed subject matter. Thus, the material choices and selections presented are merely provided as an aid in understanding one example of a fabrication process.

For example, various types of semiconductor materials, (e.g., single-crystal or amorphous silicon, germanium, other elemental semiconductor materials, compound semiconductor materials, etc.) may be used as an alternative for or in conjunction with other types of semiconductor material. Additionally, various types of insulating materials, such as tantalum pentoxide ($Ta_2O_5$), silicon nitride ($Si_xN_y$), aluminum oxide ($Al_2O_3$), hafnium oxide ($HfO_2$), and a variety of other organic or inorganic insulating materials, may be used as an alternative to or in conjunction with others of the materials described. Also, various other combinations of materials may also be substituted or included. For example, in certain applications, described semiconductor materials may be substituted with conductor materials including, for example, silver (Ag), copper (Cu), Aluminum (Al), zinc (Zn), platinum (Pt), tungsten (W), titanium (Ti), or tantalum (Ta).

Further, various formation, process, and other discussions that follow may refer to one material placed, for example, "over," "above," or "atop" another material. Such descriptors are relative terms only and obviously depend upon an exact orientation of any resulting device. However, a person of ordinary skill in the art will readily understand the context of such relative terms upon reading and understanding the disclosure provided herein in conjunction with the respective drawings.

Figure 6A:
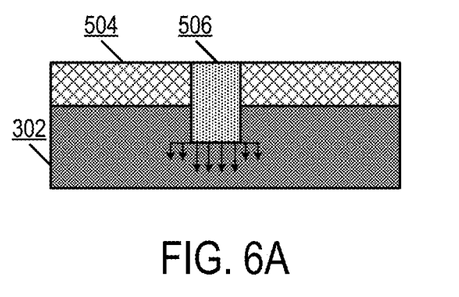
FIGS. 6A and 6B are block diagrams illustrating stress distributions on an inset tungsten plug according to some embodiments of the disclosure.
Figure 6B:
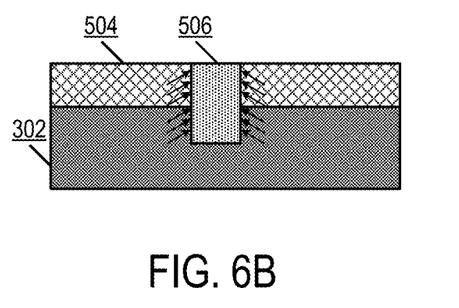

FIGS. 6A and 6B are block diagrams illustrating stress distributions on an inset tungsten plug according to some embodiments of the disclosure. As illustrated in FIG. 6A, when the plug (506) is inserted further into source plate (302) and through silicon oxide layer (304), the downward stress distribution is distributed within the substrate itself, thus anchoring the pillar firmly within the substrate itself. Further, as illustrated in FIG. 6B, the skin friction exerted on the plug (506) is also distributed in both the silicon oxide layer (304) and the source plate (302) which further retains the plug and pillar situated above the plug.

The disclosure includes various devices which perform the methods and implement the systems described above, including data processing systems which perform these methods, and computer readable media containing instructions which when executed on data processing systems cause the systems to perform these methods.

The description and drawings are illustrative and are not to be construed as limiting. Numerous specific details are described to provide a thorough understanding. However, in certain instances, well-known or conventional details are not described in order to avoid obscuring the description. References to one or an embodiment in the present disclosure are not necessarily references to the same embodiment; and, such references mean at least one.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

In this description, various functions and operations may be described as being performed by or caused by software code to simplify description. However, those skilled in the art will recognize what is meant by such expressions is that the functions result from execution of the code by one or more processors, such as a microprocessor, Application-Specific Integrated Circuit (ASIC), graphics processor, and/or a Field-Programmable Gate Array (FPGA). Alternatively, or in combination, the functions and operations can be implemented using special purpose circuitry (e.g., logic circuitry), with or without software instructions. Embodiments can be implemented using hardwired circuitry without software instructions, or in combination with software instructions. Thus, the techniques are not limited to any specific combination of hardware circuitry and software, nor to any particular source for the instructions executed by a computing device.

While some embodiments can be implemented in fully functioning computers and computer systems, various embodiments are capable of being distributed as a computing product in a variety of forms and are capable of being applied regardless of the particular type of machine or computer-readable media used to actually effect the distribution.

At least some aspects disclosed can be embodied, at least in part, in software. That is, the techniques may be carried out in a computing device or other system in response to its processor, such as a microprocessor, executing sequences of instructions contained in a memory, such as ROM, volatile RAM, non-volatile memory, cache or a remote storage device.

Routines executed to implement the embodiments may be implemented as part of an operating system, middleware, service delivery platform, SDK (Software Development Kit) component, web services, or other specific application, component, program, object, module or sequence of instructions referred to as "computer programs." Invocation interfaces to these routines can be exposed to a software development community as an API (Application Programming Interface). The computer programs typically comprise one or more instructions set at various times in various memory and storage devices in a computer, and that, when read and executed by one or more processors in a computer, cause the computer to perform operations necessary to execute elements involving the various aspects.

A machine readable medium can be used to store software and data which when executed by a computing device causes the device to perform various methods. The executable software and data may be stored in various places including, for example, ROM, volatile RAM, non-volatile memory and/or cache. Portions of this software and/or data may be stored in any one of these storage devices. Further, the data and instructions can be obtained from centralized servers or peer to peer networks. Different portions of the data and instructions can be obtained from different centralized servers and/or peer to peer networks at different times and in different communication sessions or in a same communication session. The data and instructions can be obtained in entirety prior to the execution of the applications. Alternatively, portions of the data and instructions can be obtained dynamically, just in time, when needed for execution. Thus, it is not required that the data and instructions be on a machine readable medium in entirety at a particular instance of time.

Examples of computer-readable media include but are not limited to recordable and non-recordable type media such as volatile and non-volatile memory devices, read only memory (ROM), random access memory (RAM), flash memory devices, solid-state drive storage media, removable disks, magnetic disk storage media, optical storage media (e.g., Compact Disk Read-Only Memory (CD ROMs), Digital Versatile Disks (DVDs), etc.), among others. The computer-readable media may store the instructions.

In general, a tangible or non-transitory machine readable medium includes any mechanism that provides (e.g., stores) information in a form accessible by a machine (e.g., a computer, mobile device, network device, personal digital assistant, manufacturing tool, any device with a set of one or more processors, etc.).

In various embodiments, hardwired circuitry may be used in combination with software and firmware instructions to implement the techniques. Thus, the techniques are neither limited to any specific combination of hardware circuitry and software nor to any particular source for the instructions executed by a computing device.

Various embodiments set forth herein can be implemented using a wide variety of different types of computing devices. As used herein, examples of a "computing device" include, but are not limited to, a server, a centralized computing platform, a system of multiple computing processors and/or components, a mobile device, a user terminal, a vehicle, a personal communications device, a wearable digital device, an electronic kiosk, a general purpose computer, an electronic document reader, a tablet, a laptop computer, a smartphone, a digital camera, a residential domestic appliance, a television, or a digital music player. Additional examples of computing devices include devices that are part of what is called "the internet of things" (IOT). Such "things" may have occasional interactions with their owners or administrators, who may monitor the things or modify settings on these things. In some cases, such owners or administrators play the role of users with respect to the "thing" devices. In some examples, the primary mobile device (e.g., an Apple iPhone) of a user may be an administrator server with respect to a paired "thing" device that is worn by the user (e.g., an Apple watch).

In some embodiments, the computing device can be a computer or host system, which is implemented, for example, as a desktop computer, laptop computer, network server, mobile device, or other computing device that includes a memory and a processing device. The host system can include or be coupled to a memory sub-system so that the host system can read data from or write data to the memory sub-system. The host system can be coupled to the memory sub-system via a physical host interface. In general, the host system can access multiple memory sub-systems via a same communication connection, multiple separate communication connections, and/or a combination of communication connections.

In some embodiments, the computing device is a system including one or more processing devices. Examples of the processing device can include a microcontroller, a central processing unit (CPU), special purpose logic circuitry (e.g., a field programmable gate array (FPGA), an application specific integrated circuit (ASIC), etc.), a system on a chip (SoC), or another suitable processor.

Although some of the drawings illustrate a number of operations in a particular order, operations which are not order dependent may be reordered and other operations may be combined or broken out. While some reordering or other groupings are specifically mentioned, others will be apparent to those of ordinary skill in the art and so do not present an exhaustive list of alternatives. Moreover, it should be recognized that the stages could be implemented in hardware, firmware, software or any combination thereof.

In the foregoing specification, the disclosure has been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. A semiconductor device comprising:
   a source plate;
   a plurality of tungsten plugs fabricated on, or at least formed partly in, the source plate;
   a stack formed on the source plate and the plurality of tungsten plugs, the stack comprising alternating insulating layers and conductive layers;
   a first set of pillars extending through the stack formed by a process including etching the alternating insulating layers and conductive layers and depositing a pillar material therein, wherein each pillar in the first set of pillars terminates atop a respective tungsten plug in the plurality of tungsten plugs and forms a channel-material string of memory cells extending through the insulating layers and conductive layers; and
   a second set of pillars extending through the stack formed by a process including etching the alternating insulating layers and conductive layers and depositing a pillar material therein, wherein each pillar in the second set of pillars terminates in the source plate.

2. The device of claim 1, wherein the source plate comprises a silicon substrate.

3. The device of claim 2, wherein the source plate further comprises one or more layers.

4. The device of claim 3, wherein the source plate does not conductively contact any of the second set of pillars.

5. The device of claim 1, wherein the insulating material comprises silicon oxide.

6. The device of claim 5, wherein the conductive material comprises silicon nitride.

7. The device of claim 5, wherein the conductive material comprises tungsten.

8. The device of claim 1, wherein the first set of pillars and the second set of pillars comprise cylindrical pillars.

9. The device of claim 1, wherein the first set of pillars alternate with respect to the second set of pillars.

10. The device of claim 1, wherein the first set of pillars further includes a polysilicon coating.

11. The device of claim 10, wherein the first set of pillars comprise silicon dioxide pillars.

12. The device of claim 11, wherein the second set of pillars further includes a polysilicon coating.

13. The device of claim 12, wherein the second set of pillars comprise silicon dioxide pillars.

14. The device of claim 1, wherein the insulating layer comprises a material selected from the group consisting of silicon nitride, tantalum pentoxide, aluminum oxide, and hafnium oxide.

15. The device of claim 1, wherein the alternating insulating layers and conductive layers and the source plate are separated by a layer of silicon oxide.

16. The device of claim 15, wherein a layer of the insulating layers is layered atop of the layer of silicon oxide.

* * * * *